US011614770B2

(12) United States Patent
Liu et al.

(10) Patent No.: US 11,614,770 B2
(45) Date of Patent: Mar. 28, 2023

(54) METHODS AND APPARATUS FOR ORGANIZING A PROGRAMMABLE SEMICONDUCTOR DEVICE INTO MULTIPLE CLOCK REGIONS

(71) Applicant: GOWIN Semiconductor Corporation, GuangZhou (CN)

(72) Inventors: Jianhua Liu, Fremont, CA (US); Jinghui Zhu, San Jose, CA (US); Ning Song, Cupertino, CA (US); Tianping Wang, Shanghai (CN); Chienkuang Chen, Santa Clara, CA (US); Diwakar Chopperla, Fremont, CA (US); Tianxin Wang, Shanghai (CN); Zhenyu Gu, Shanghai (CN); Xiaozhi Lin, Shanghai (CN)

(73) Assignee: GOWIN SEMICONDUCTOR CORPORATION, Guangzhou (CN)

( * ) Notice: Subject to any disclaimer, the term of this patent is extended or adjusted under 35 U.S.C. 154(b) by 0 days.

(21) Appl. No.: 17/023,145

(22) Filed: Sep. 16, 2020

(65) Prior Publication Data

US 2022/0083094 A1 Mar. 17, 2022

(51) Int. Cl.
| | |
|---|---|
| *G06F 1/10* | (2006.01) |
| *G06F 1/06* | (2006.01) |
| *G06F 30/396* | (2020.01) |
| *G06F 30/34* | (2020.01) |
| *G06F 1/08* | (2006.01) |
| *G06F 1/04* | (2006.01) |

(52) U.S. Cl.
CPC ............ *G06F 1/10* (2013.01); *G06F 1/06* (2013.01); *G06F 1/04* (2013.01); *G06F 1/08* (2013.01); *G06F 30/34* (2020.01); *G06F 30/396* (2020.01)

(58) Field of Classification Search
CPC ... G06F 1/08; G06F 30/34; G06F 1/04; G06F 1/10; G06F 1/06; G06F 30/396
USPC .......................... 713/501, 600; 716/116, 117
See application file for complete search history.

(56) References Cited

U.S. PATENT DOCUMENTS

| | | | |
|---|---|---|---|
| 5,430,397 A | 7/1995 | Itoh | |
| 5,903,165 A | 5/1999 | Jones | |
| 6,996,736 B1 | 2/2006 | Nguyen | |
| 8,581,653 B1 * | 11/2013 | Maruri | G06F 1/10 327/291 |
| 11,216,022 B1 * | 1/2022 | Liu | G06F 1/04 |
| 2006/0006918 A1 * | 1/2006 | Saint-Laurent | H03L 7/0995 327/295 |
| 2007/0188189 A1 * | 8/2007 | Venkata | H03K 19/17744 326/41 |

(Continued)

*Primary Examiner* — Ji H Bae
(74) *Attorney, Agent, or Firm* — JW Law Group; James M. Wu

(57) ABSTRACT

A configurable semiconductor device ("CSD") is organized in four (4) quadrants able to perform user-defined logic functions via a clock fabric. The first quadrant, in one embodiment, includes a first serializer and deserializer ("SerDes") region and a bank0 region for data processing. The second quadrant includes a second SerDes region and a bank5 region and the third quadrant contains a bank3 region and a bank4 region. The fourth quadrant includes a bank1 region and a bank2 region. The clock fabric is configured to provide a set of programmable or selectable clock signals with different clock speeds to various regions within the CSD.

20 Claims, 14 Drawing Sheets

(56) References Cited

U.S. PATENT DOCUMENTS

| | | | | |
|---|---|---|---|---|
| 2010/0134142 A1* | 6/2010 | Bakker | ............... | G06F 30/34 |
| | | | | 326/39 |
| 2016/0321385 A1* | 11/2016 | Chen | ............... | G06F 30/34 |
| 2017/0367061 A1* | 12/2017 | Kim | ............... | H04W 56/005 |
| 2018/0239738 A1* | 8/2018 | Teh | ............... | G06F 1/06 |
| 2019/0065188 A1* | 2/2019 | Shippy | ............... | G06F 9/3887 |
| 2021/0027677 A1* | 1/2021 | Jiang | ............... | H01L 51/5281 |

\* cited by examiner

METHODS AND APPARATUS FOR ORGANIZING A PROGRAMMABLE SEMICONDUCTOR DEVICE INTO MULTIPLE CLOCK REGIONS

RELATED APPLICATION

This application is related to the following co-pending application assigned to the Assignee of the present invention.

a. application Ser. No. 17/023,178, filed Sep. 16, 2020, entitled "Methods and Apparatus for Providing A Clock Fabric for an FPGA Organized in Multiple Clock Regions," invented by the same inventors, which has been issued into a U.S. patent with a U.S. Pat. No. 11,216,022 on Jan. 4, 2022.

FIELD

The exemplary embodiment(s) of the present application relates to the field of programmable semiconductor devices for logic operations involving in the computer hardware and software. More specifically, the exemplary embodiment(s) of the present invention relates to clock distributions to a field-programmable gate array ("FPGA") or programmable logic device ("PLD") based on clock regions.

BACKGROUND

With increasing popularity of digital communication, artificial intelligence (AI), IoT (Internet of Things), and/or robotic controls, the demand for faster, flexible, and efficient hardware and/or semiconductors with processing capabilities is constantly in demand. To meet such demand, high-speed and flexible semiconductor chips are generally more desirable. One conventional approach to satisfy such demand is to use dedicated custom integrated circuits and/or application-specific integrated circuits ("ASICs"). A shortcoming with the ASIC approach is that it lacks flexibility while consumes a large number of resources.

An alternative approach, which enjoys the growing popularity, is utilizing programmable semiconductor devices ("PSDs") such as programmable logic devices ("PLDs") or field-programmable gate arrays ("FPGAs"). A feature of PSD is that it allows an end-user to program and/or reprogram one or more desirable functions to suit his/her applications after the PSD is fabricated.

A drawback, however, associated with a conventional FPGA or PLD is that it is difficult to provide a clock distribution having different clock speeds across various sections of an FPGA or PLD.

SUMMARY

Embodiments of the present application disclose one or more configurable semiconductor devices ("CSDs") such as a field-programmable gate array ("FPGA") divided or organized into four (4) logic quadrants as clock regions for performing user-defined logic functions. The first quadrant, in one example, includes a first serializer and deserializer ("SerDes") region and a bank0 region for data processing. The SerDes region includes logic blocks for facilitating data communication. The bank0 region includes logic blocks and input/output ("IO") bank for delivering user-defined logic operations. The second quadrant includes a second SerDes region and a bank5 region. The third quadrant contains a bank3 region and a bank4 region. The fourth quadrant includes a bank1 region and a bank2 region. A clock fabric, in one aspect, can provide a set of programmable or selectable clock signals with different clock speeds to various regions within a CSD.

In one aspect, an FPGA includes configurable logic blocks organized in multiple clock regions with a clock fabric for facilitating user-defined logic functions. The clock fabric provides a set of regional clock signals ("RCSs") generated from a clock source with a first clock signal quality ("CSQ") for clocking logic blocks in a clock region. Also, a set of neighboring clock signals ("NCSs") or inter-regional clock signals are generated from a neighboring clock source(s) for clocking logic blocks in two neighboring clock regions. The clock fabric is also capable of optionally generating a set of secondary clock signals ("SCSs") based on RCSs with a second CSQ for clocking logic blocks with less time-sensitive logic operations.

Additional features and benefits of the exemplary embodiment(s) of the present invention will become apparent from the detailed description, figures, and claims set forth below.

BRIEF DESCRIPTION OF THE DRAWINGS

The exemplary embodiment(s) of the present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Figure 1A:
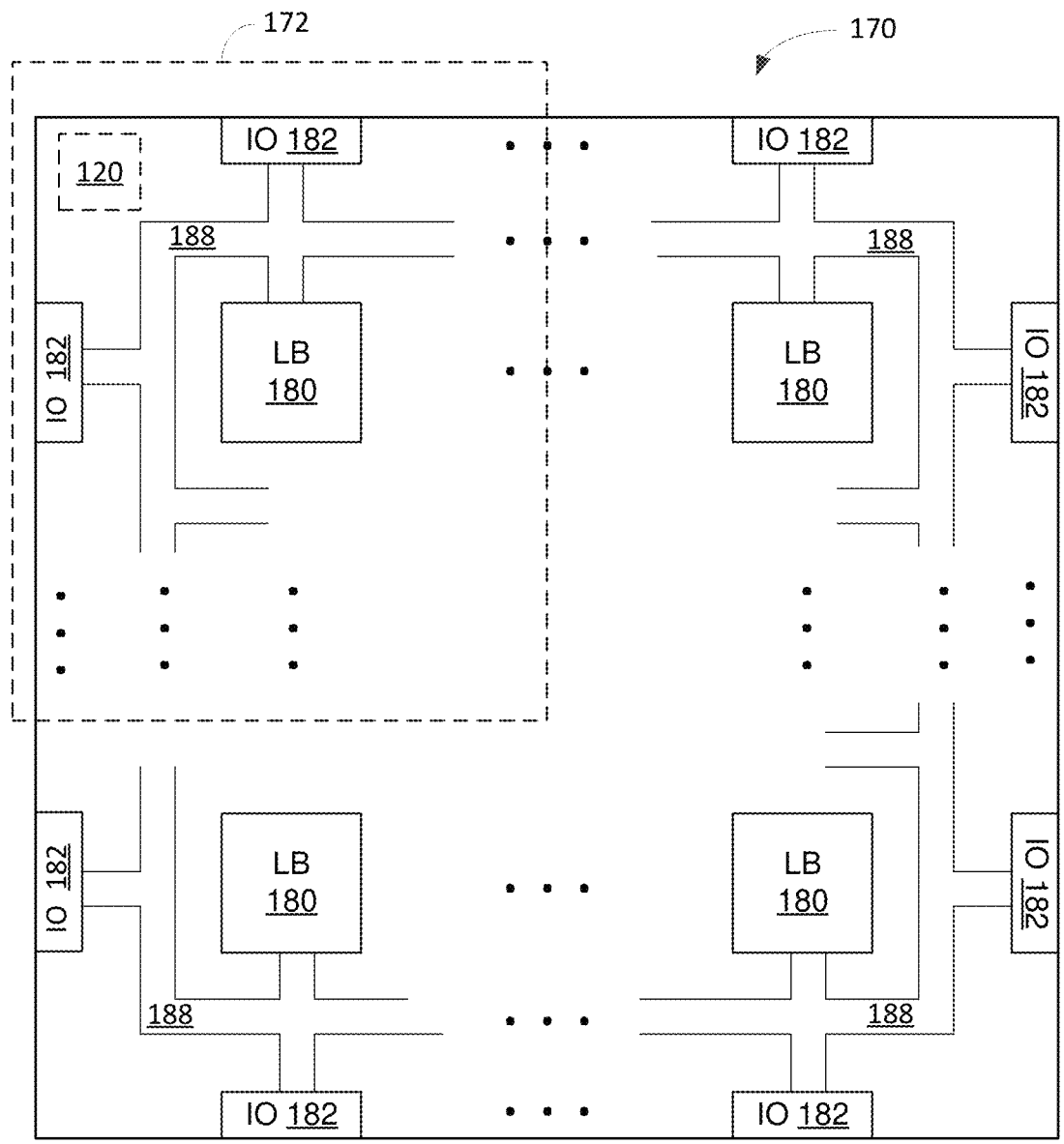
FIGS. 1A-1B are block diagrams illustrating a programmable semiconductor device ("PSD") capable of providing user-defined logic operations via a configurable clock distributor ("CCD") in accordance with one embodiment of the present invention.

Embodiments of the present invention disclose a method(s) and/or apparatus for providing a programmable semiconductor device ("PSD") or programmable integrated circuit ("PIC") configured to provide additional flexibility with individual clock regions.

The purpose of the following detailed description is to provide an understanding of one or more embodiments of the present invention. Those of ordinary skills in the art will realize that the following detailed description is illustrative only and is not intended to be in any way limiting. Other embodiments will readily suggest themselves to such skilled persons having the benefit of this disclosure and/or description.

In the interest of clarity, not all of the routine features of the implementations described herein are shown and described. It will, of course, be understood that in the development of any such actual implementation, numerous implementation-specific decisions may be made in order to achieve the developer's specific goals, such as compliance with application- and business-related constraints, and that these specific goals will vary from one implementation to another and from one developer to another. Moreover, it will be understood that such a development effort might be complex and time-consuming but would nevertheless be a routine undertaking of engineering for those of ordinary skills in the art having the benefit of embodiment(s) of this disclosure.

Various embodiments of the present invention illustrated in the drawings may not be drawn to scale. Rather, the dimensions of the various features may be expanded or reduced for clarity. In addition, some of the drawings may be simplified for clarity. Thus, the drawings may not depict all of the components of a given apparatus (e.g., device) or method. The same reference indicators will be used throughout the drawings and the following detailed description to refer to the same or like parts.

In accordance with the embodiment(s) of the present invention, the components, process steps, and/or data structures described herein may be implemented using various types of operating systems, computing platforms, computer programs, and/or general-purpose machines. In addition, those of ordinary skills in the art will recognize that devices of a less general-purpose nature, such as hardware devices, field-programmable gate arrays (FPGAs), application-specific integrated circuits (ASICs), or the like, may also be used without departing from the scope and spirit of the inventive concepts disclosed herein. Where a method comprising a series of process steps is implemented by a computer or a machine and those process steps can be stored as a series of instructions readable by the machine, they may be stored on a tangible medium such as a computer memory device, such as but not limited to, magnetoresistive random access memory ("MRAM"), phase-change memory, or ferroelectric RAM ("FeRAM"), flash memory, ROM (Read Only Memory), PROM (Programmable Read-Only Memory), EEPROM (Electrically Erasable Programmable Read-Only Memory), Jump Drive, magnetic storage medium (e.g., tape, magnetic disk drive, and the like), optical storage medium (e.g., CD-ROM, DVD-ROM, paper card and paper tape, and the like) and other known types of program memory.

The term "system" or "device" is used generically herein to describe any number of components, elements, subsystems, devices, packet switch elements, packet switches, access switches, routers, networks, computer and/or communication devices or mechanisms, or combinations of components thereof. The term "computer" includes a processor, memory, and buses capable of executing instruction wherein the computer refers to one or a cluster of computers, personal computers, workstations, mainframes, or combinations of computers thereof.

Embodiments of the present application disclose one or more configurable semiconductor devices ("CSDs") such as a field-programmable gate array ("FPGA") divided or organized into four (4) logic quadrants as clock regions for performing user-defined logic functions. The first quadrant, in one example, includes a first serializer and deserializer ("SerDes") region and a bank0 region for data processing. The SerDes region includes logic blocks for facilitating data communication. The bank0 region includes logic blocks and input/output ("IO") bank for delivering user-defined logic operations. The second quadrant includes a second SerDes region and a bank5 region. The third quadrant contains a bank3 region and a bank4 region. The fourth quadrant includes a bank1 region and a bank2 region. A clock fabric, in one aspect, can provide a set of programmable or selectable clock signals with different clock speeds to various regions within a CSD.

In one aspect, an FPGA includes configurable logic blocks organized in multiple clock regions with a clock fabric for facilitating user-defined logic functions. The clock fabric provides a set of regional clock signals ("RCSs") generated from a clock source with a first clock signal quality ("CSQ") for clocking logic blocks in a clock region. Also, a set of neighboring clock signals ("NCSs") or inter-regional clock signals are generated from a neighboring clock source(s) for clocking logic blocks in two neighboring clock regions. The clock fabric is also capable of optionally generating a set of secondary clock signals ("SCSs") based on RCSs with a second CSQ for clocking logic blocks with less time-sensitive logic operations. It should be noted that clock, clock signal, clock cycle, clock frequency are referring the same or similar clocking signal, and they can be used interchangeably.

FIG. 1A is a block diagram 170 illustrating a programmable semiconductor device ("PSD") capable of providing user-defined logic operations via a configurable clock distributor ("CCD") in accordance with one embodiment of the present invention. PSD, also known as FPGA, PIC, and/or a type of Programmable Logic Device ("PLD"), includes a clock fabric 120 capable of facilitating the CCD process. A function of CCD is to facilitate a different portion of logic blocks within the PSD running at different clock speeds so that it enhances overall versatilities as well as the efficiency of PSD. It should be noted that the underlying concept of the exemplary embodiment(s) of the present invention would not change if one or more blocks (circuit or elements) were added to or removed from diagram 170.

PSD includes an array of configurable logic blocks ("LBs") 180 surrounded by input/output blocks ("IOs") 182, and programmable interconnect resources 188 ("PIR") that include vertical interconnections and horizontal interconnections extending between the rows and columns of LB 180 and IO 182. PRI 188 may further include interconnecting array decoders ("IAD") or programmable interconnection array ("PIA"). It should be noted that the terms PRI, IAD, and PIA may be used interchangeably hereinafter.

Each LB, in one example, includes programmable combinational circuitry and selectable output registers programmed to implement at least a portion of a user's logic function. The programmable interconnections, connections, or channels of interconnect resources are configured using various switches to generate signal paths between the LBs 180 for performing logic functions. Each IO 182 is programmable to selectively use an IO pin (not shown) of PSD.

PIC, in one embodiment, can be divided into multiple programmable partitioned regions ("PPRs") 172 wherein each PPR 172 includes a portion of LBs 180, some PPRs 188, and IOs 182. A benefit of organizing PIC into multiple PPRs 172 is to optimize management of storage capacity, power supply, and/or network transmission.

Bitstream is a binary sequence (or a file) containing programming information or data for a PIC, FPGA, or PLD. The bitstream is created to reflect the user's logic functions together with certain controlling information. For an FPGA or PLD to function properly, at least a portion of the registers or flipflops in FPGA needs to be programmed or configured before it can function. It should be noted that bitstream is used as input configuration data to FPGA.

A benefit of using the CCD process is to facilitate different clock speeds running at different regions simultaneously to enhance the overall efficiency of FPGA.

Figure 1B:
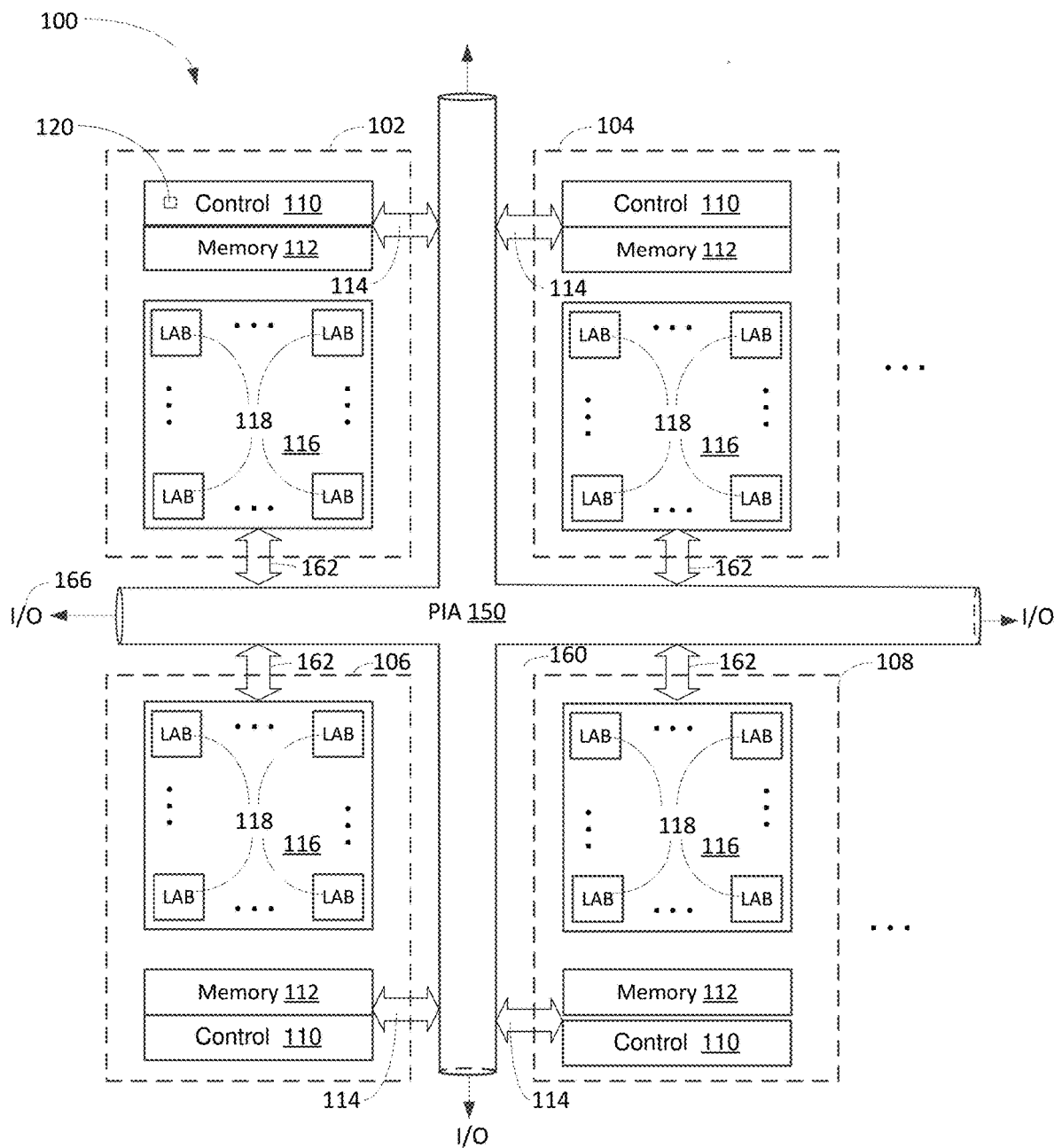

FIG. 1B is a block diagram illustrating a PSD operable to carry out various user-defined logic operations using CCD in accordance with one embodiment of the present invention. To simplify the foregoing discussion, the terms "PSD", "PIC", FPGA, and PLD are referring the same or similar devices and they can be used interchangeably hereinafter. Diagram 100 includes multiple PPRs 102-108, PIA 150, and regional IO ports 166. PPRs 102-108 further includes control units 110, memory 112, and LBs 116. Note that control units 110 can be configured into one single control unit, and similarly, memory 112 can also be configured into one single memory for storing configurations. It should be noted that the underlying concept of the exemplary embodiment(s) of the present invention would not change if one or more blocks (circuit or elements) were added to or removed from diagram 100.

LBs 116, also known as configurable function unit ("CFU") include multiple logic array blocks ("LABs") 118 which is also known as a configurable logic unit ("CLU"). Each LAB 116, for example, can be further organized to include, among other circuits, a set of programmable logical elements ("LEs"), configurable logic slices ("CLS"), or macrocells, not shown in FIG. 1B. Each LAB, in one example, may include anywhere from 32 to 512 programmable LEs. IO pins (not shown in FIG. 1B), LABs, and LEs are linked by PIA 150 and/or other buses, such as buses 162 or 114, for facilitating communication between PIA 150 and PPRs 102-108.

Each LE includes programmable circuits such as the product-term matrix, lookup tables, and/or registers. LE is also known as a cell, configurable logic block ("CLB"), slice, CFU, macrocell, and the like. Each LE can be independently configured to perform sequential and/or combinatorial logic operation(s). It should be noted that the underlying concept of PSD would not change if one or more blocks and/or circuits were added or removed from PSD.

Control units 110, also known as configuration logics, can be a single control unit. Control unit 110, for instance, manages and/or configures individual LE in LAB 118 based on the configuring information stored in memory 112. It should be noted that some IO ports or IO pins are configurable so that they can be configured as input pins and/or output pins. Some IO pins are programmed as bi-directional IO pins while other IO pins are programmed as unidirectional IO pins. The control units such as unit 110 are used to handle and/or manage PSD operations in accordance with system clock signals.

LBs 116 include multiple LABs that can be programmed by the end-user(s). Each LAB contains multiple LEs wherein each LE further includes one or more lookup tables ("LUTs") as well as one or more registers (or D flip-flops or latches). Depending on the applications, LEs can be configured to perform user-specific functions based on a pre-defined functional library facilitated by the configuration software. PSD, in some applications, also includes a set fixed circuit for performing specific functions. For example, the fixed circuits include, but not limited to, a processor(s), a DSP (digital signal processing) unit(s), a wireless transceiver(s), and so forth.

PIA 150 is coupled to LBs 116 via various internal buses such as buses 114 or 162. In some embodiments, buses 114 or 162 are part of PIA 150. Each bus includes channels or wires for transmitting signals. It should be noted that the terms channel, routing channel, wire, bus, connection, and interconnection are referred to as the same or similar connections and will be used interchangeably herein. PIA 150 can also be used to receive and/or transmits data directly or indirectly from/to other devices via IO pins and LABs.

Memory 112 may include multiple storage units situated across a PPR. Alternatively, memories 112 can be combined into one single memory unit in PSD. In one embodiment, memory 112 is an NVM storage unit used for both configuration and user memory. The NVM storage unit can be, but not limited to, MRAM, flash, Ferroelectric RAM, and/or phase changing memory (or chalcogenide RAM). Depending on the applications, a portion of the memory 112 can be designated, allocated, or configured to be a block RAM ("BRAM") used for storing large amounts of data in PSD.

A PSD includes many programmable or configurable LBs 116 that are interconnected by PIA 150, wherein each programmable LB is further divided into multiple LAB s 118. Each LAB 118 further includes many LUTs, multiplexers and/or registers. During configuration, a user programs a truth table for each LUT to implement a desired logical function. It should be noted that each LAB, which can be further organized to include multiple logic elements ("LEs"), can be considered as a configurable logic cell ("CLC") or slice. For example, a four-input (16 bit) LUT receives LUT inputs from a routing structure (not shown in FIG. 1B). Based upon the truth table programmed into LUT during configuration of PSD, a combinatorial output is generated via a programmed truth table of LUT in accordance with the logic values of LUT inputs. The combinatorial output is subsequently latched or buffered in a register or flip-flop before the clock cycle ends.

In one embodiment, control unit 110 includes a CCD component 120. It should be noted that CCD 120 can be placed anywhere within PIC or PSD for facilitating the CCD process. A function of CCD 120 is to control and manage a clock generation process to facilitate different sections of FPGA running at different clock speeds.

Figure 2:
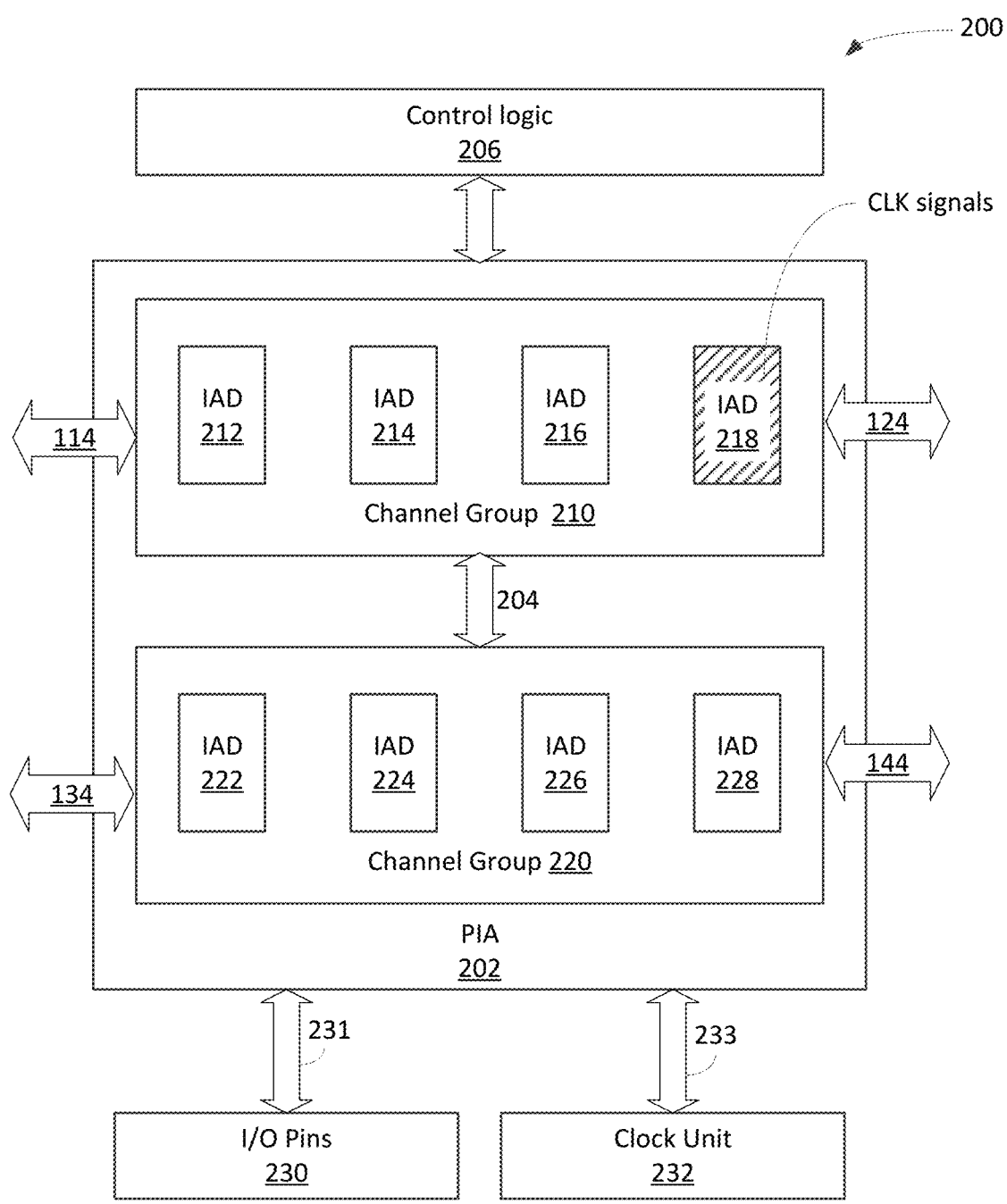
FIG. 2 is a block diagram illustrating a routing logic or routing fabric containing programmable interconnection arrays capable of routing clock signals distributed by the CCD in accordance with one embodiment of the present invention.

FIG. 2 is a block diagram 200 illustrating a routing logic or routing fabric containing programmable interconnection arrays capable of routing clock signals distributed by CCD in accordance with one embodiment of the present invention. Diagram 200 includes control logic 206, PIA 202, IO pins 230, and clock unit 232. Control logic 206, which may be similar to control units shown in FIG. 1B, provides various control functions including channel assignment, differential IO standards, and clock management. Control logic 206 may contain volatile memory, non-volatile memory, and/or a combination of the volatile and nonvolatile memory device for storing information such as configuration data. In one embodiment, control logic 206 is incorporated into PIA 202. It should be noted that the underlying concept of the exemplary embodiment(s) of the present invention would not change if one or more blocks (circuit or elements) were added to or removed from diagram 200.

IO pins 230, connected to PIA 202 via a bus 231, contain many programmable IO pins configured to receive and/or transmit signals to external devices. Each programmable IO pin, for instance, can be configured to input, output, and/or bi-directional pin. Depending on the applications, IO pins 230 may be incorporated into control logic 206.

Clock unit 232, in one example, connected to PIA 202 via a bus 233, receives various clock signals from other components, such as a clock tree circuit or a global clock oscillator. Clock unit 232, in one instance, generates clock signals in response to system clocks as well as reference clocks for implementing IO communications. Depending on the applications, clock unit 232, for example, provides clock signals to PIA 202 including reference clock(s).

PIA 202, in one aspect, is organized into an array scheme including channel groups 210 and 220, bus 204, and IO buses 114, 124, 134, 144. Channel groups 210, 220 are used to facilitate routing information between LBs based on PIA configurations. Channel groups can also communicate with each other via internal buses or connections such as bus 204. Channel group 210 further includes interconnecting array decoders ("IADs") 212-218. Channel group 220 includes four IADs 222-228. A function of IAD is to provide configurable routing resources for data transmission.

IAD such as IAD 212 includes routing multiplexers or selectors for routing signals between IO pins, feedback outputs, and/or LAB inputs to reach their destinations. For example, an IAD can include up to 36 multiplexers which can be laid out in four banks wherein each bank contains nine rows of multiplexers. It should be noted that the number of IADs within each channel group is a function of the number of LEs within the LAB.

PIA 202, in one embodiment, designates a special IAD such as IAD 218 for facilitating routing of clock signals. For example, IAD 218 handles or distributes connections and/or routings clock signals or clock trees during data transmission as well as logic operation. It should be noted that additional IADs may be allocated for CCD operations.

An advantage of using IAD 218 within PIA as a designated clock routing is to ascertain the distribution of clock signals throughout FPGA or IC chip.

Figure 3:
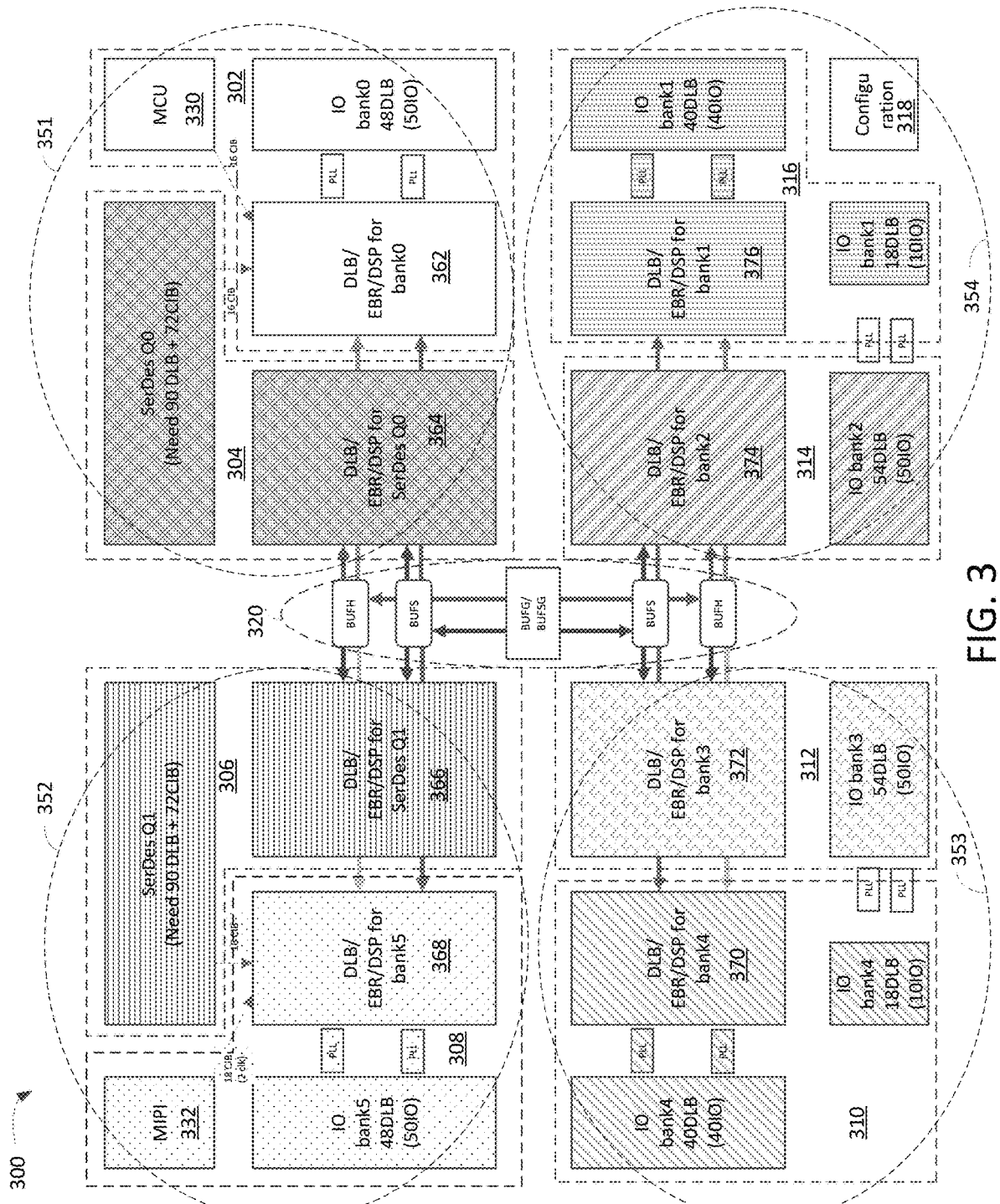
FIG. 3 is a block diagram illustrating a PSD organized or divided into four (4) quadrants containing multiple clock regions in accordance with one embodiment of the present invention.

FIG. 3 is a block diagram 300 illustrating a PSD or FPGA organized or divided into several quadrants containing clock regions in accordance with one embodiment of the present invention. PSD, also known as a semiconductor device ("CSD"), FPGA, or PLD, is organized or divided into four (4) sections or quadrants 351-354. Each quadrant or section hosts or houses multiple clock regions 302-316. It should be noted that the underlying concept of the exemplary embodiment(s) of the present invention would not change if one or more blocks (circuit or elements) were added to or removed from diagram 300.

Each quadrant of PSD, for example, includes two (2) clock regions for facilitating user-defined logic functions via a clock fabric. The first quadrant or quadrant 351 includes a serializer and deserializer ("SerDes") region 304 and bank0 region 302. Bank0 region 302 further includes a bank0 362, an input-output block ("IO bank0), and a microcontroller unit ("MCU") 330. MCU 330 can also be optionally situated in an independent clock region from bank0 region 302 for providing MCU functions. While IO bank0 provides communication between external devices and logic blocks in bank0 362 via IO pins, bank0 362 includes various logic blocks including, but not limited to, digital logic block ("DLB"), embedded block ram ("EBR"), and digital signal processing ("DSP") block for delivering, for instance, user-defined logic functions. While DLB includes configurable LBs capable of performing user-defined logic functions, EMB includes memory cells used for programming logic functions such as LUTs. DSP provides specialized processing capabilities that are optimized for predefined processing operations.

SerDes region 304 includes logic block 364 containing DLB, EBR, and DSP for carrying out various serializing and/or deserializing functions for data communication. A function of a serializer or deserializer is to facilitate high-speed communications. It should be noted that SerDes block 364 such as SerDes Q0 is capable of converting data between serial and parallel interfaces for data transmission.

The second quadrant or quadrant 352 includes a second SerDes region 306 and bank5 region 308. While SerDes region 306 includes a CBI (common installation bus) block and logic block 366, bank5 region 308 includes IO block5, logic block 368, and a Mobile Industry Processor Interface ("MIPI") block 332. It should be noted that MIPI block 332 can be an independent region depending on the applications. A function of MIPI is to establish wireless communications with various mobile systems. Logic block 368, in one example, includes DLB, EBR, and/or DSP for carrying out user-defined logic functions.

The third quadrant or quadrant 353 includes a bank3 region 312 and a bank4 region 310. Bank3 region 312 includes a logic block 372 and an IO bank3. While IO bank3 provides communication between external devices and logic block 372, logic block 372 includes DLB, EBR, and/or DSP for carrying out user-defined logic functions. Bank4 region 310 includes a logic block 370 which includes DLB, EBR, and/or DSP for performing logic functions.

The fourth quadrant or quadrant 354 includes a bank1 region 316 and bank2 region 314. Bank1 region 316 includes a logic block 376 and an IO bank1. While IO bank1 provides communication between external devices and bank1 376, bank1 376 includes DLB, EBR, and/or DSP for delivering user-defined logic functions. Bank2 region 314 includes a logic block 370 which includes DLB, EBR, and/or DSP for performing logic functions.

A clock fabric 320, in one embodiment, is configured to provide multiple different sets of clocks or clock signals at different speeds. For example, clock fabric 320 provides multiple sets of clock signals for multiple clock regions wherein different sets of clock signals contain different clock qualities. In one embodiment, clock fabric 320 is capable of performing CCD operation to provide a global clock signal for all regions when entire PSD or FPGA are synchronized with one global clock or global clock signal.

Clock fabric 320 is configured to facilitate the performance of CCD via its regional, inter-regional, and global clock network. For example, CCD is required to provide sufficient clock signals to drive eight (8) regions 302-316 of PSD. The eight (8) regions 302-316 include two (2) SerDes banks 364-366 on top quadrants or top portion of PSD and six (6) logic blocks with IOs on the left, right, and/or bottom of PSD. In one example, a primary clock region includes eight (8) primary clocks ("BUFH") which are used to drive the clock network (or fabric) as well as IOs in the regions.

Each region, in one example, includes two (2) PLL (Phase Lock Loop), one (1) IO bank with four (4) clock IO. Alternatively, a region includes one (1) SerDes bank and a various number of fabric blocks. Within a region, the primary clock sources include clock IO/SerDes clocks and 12 PLL output clocks, and PLLs. PLLs have reference clocks driven by clock IO, primary clocks, and feedback path from fabric or internal.

In an alternative embodiment, an FPGA or CSD is organized in quadrants able to perform user-defined logic functions. For example, FPGA includes a first SerDes region 304 situated in a first quadrant, second SerDes region 306 situated in a second quadrant, and a clock fabric 320 situated in the middle of FPGA. SerDes region 304 includes a SerDes configurable block 364 and a first SerDes interface block. SerDes region 304 is used to facilitate data transmission in response to a first regional clock signal.

Second SerDes region 306 includes a second SerDes configurable block 366 and a second SerDes interface block. Second SerDes region 306 is used to facilitate data transmission in response to a second regional clock signal. Clock fabric 320, in one embodiment, provides the first regional clock signal and second regional clock signal for clocking first SerDes region 304 and second SerDes region 306, respectively. In one aspect, the first regional clock and the second regional clock are different clock frequencies.

Bank0 region 302 is situated in the first quadrant or quadrant 351 containing a bank0 configurable block 362 and a bank0 IO (or IO) block. Bank0 region 302 is configured to facilitate data processing in response to a third regional clock signal.

Bank5 region 308 is situated in the second quadrant or quadrant 352 of FPGA containing a bank5 configurable block 368 and a bank5 IO block. Bank5 region 398 is capable of facilitating data processing in response to a fourth regional clock signal. Bank1 region 316 is situated in a fourth quadrant or quadrant 354 of FPGA containing a bank1 configurable block 376 and a bank1 IO block. Bank1 region 316 facilitates data processing in response to a fifth regional clock signal.

Bank2 region 314 is situated in the fourth quadrant or quadrant 354 containing a bank2 configurable block 374 and a bank2 IO block. Bank2 region 314 is configured to facilitate data processing in response to a sixth regional clock signal. Bank3 region 312 is situated in a third quadrant or quadrant 353 of FPGA including a bank3 configurable block 372 and a bank3 IO block. Bank3 region 312 facilitates data processing in response to a seventh regional clock signal. Bank4 region 310 is situated in the third quadrant or quadrant 353 having a bank4 configurable block 370 and a bank4 IO block. Bank4 region provides data processing in response to an eighth regional clock signal.

In one embodiment, CCD generates specific regional clocks for corresponding regions. For example, CCD generates a set of third regional clocks for bank0 region 302. An advantage of using clock regions with clock fabric is that it allows different regions operating with different clock speeds.

Figure 4:
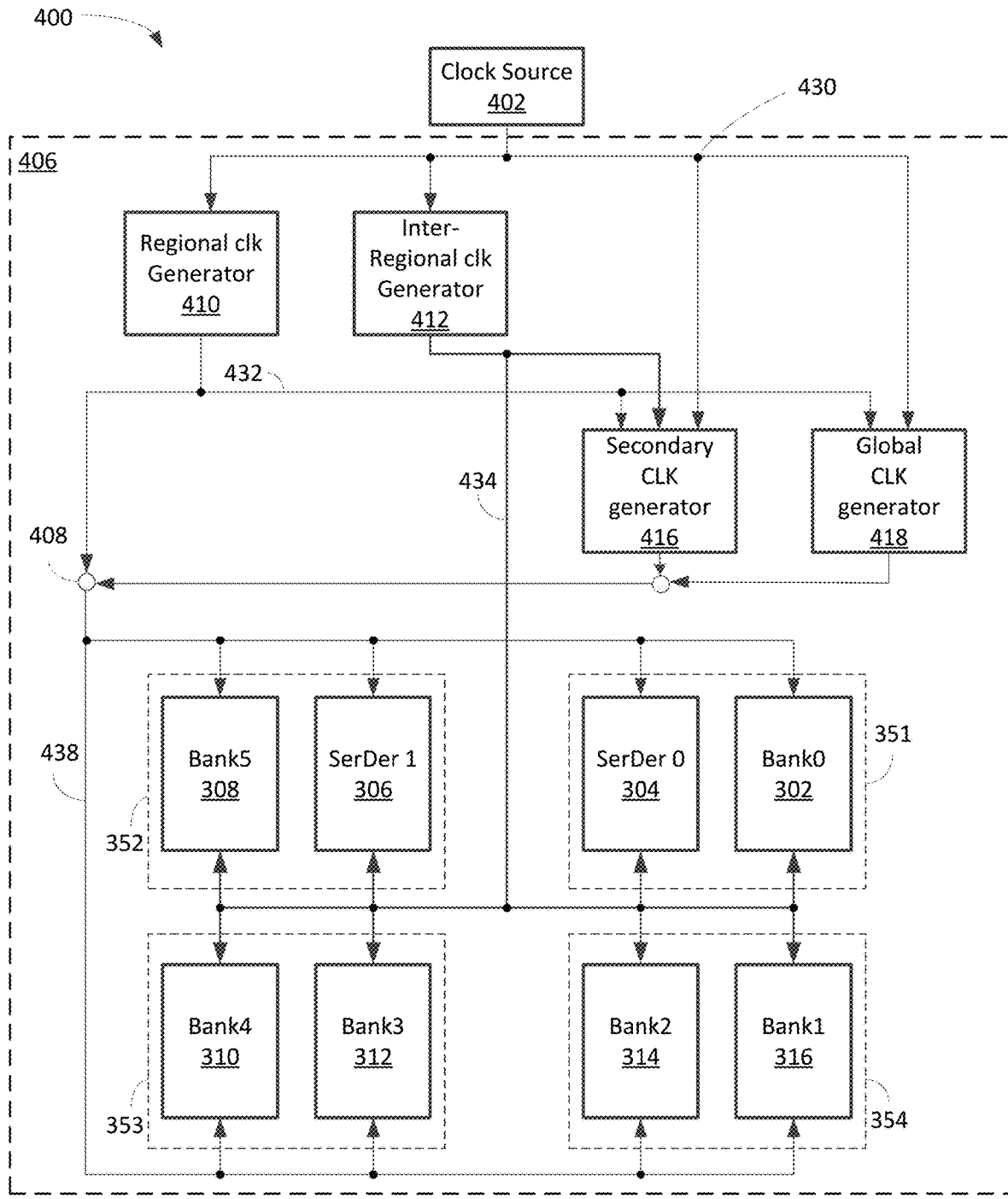
FIG. 4 is a block diagram illustrating a CCD configured to clock various clock regions across a PSD (or FPGA) in accordance with one embodiment of the present invention.

FIG. 4 is a block diagram 400 illustrating a CCD configured to distribute clocks to regions across a PSD (or FPGA) in accordance with one embodiment of the present invention. Diagram 400 includes a clock source 402 and a PSD (or FPGA). In one aspect, clock source 402 is situated external to FPGA via a clock bank(s). Alternatively, clock source 402 can be a clock generator or embedded oscillator situated inside of FPGA. Also, clock source 402 can receive clocks generated by multiple embedded oscillators with different clock frequencies. It should be noted that the underlying concept of the exemplary embodiment(s) of the present invention would not change if one or more blocks (circuit or elements) were added to or removed from diagram 400.

CCD, in one example, is a programmable clock fabric capable of providing multiple sets of clocks for different purposes. CCD includes a regional clock generator 410, an inter-regional clock generator 412, a secondary clock generator 416, and a global clock generator 418. It should be noted that generators 410-418 can be individual clock generators or may be combined into one single clock generator. Depending on the applications, CCD can be configured to provide different clock speeds to different clock regions such as regions 302-316.

Regional clock generator 410, in one embodiment, is configured to generate a set of RCSs or clocks based on an output of clock source 402 and other feedback inputs. For example, an output of PLL is used to generate one or more RCSs. RCS is a primary regional clock with high CSQ since RCS is a high-speed clock signal with relatively low tolerance of clock skew. A function of RCSs is to drive logics in different regions with different clock speeds. For example, RCSs are used to clock DLBs, EBR, and/or DSP units in the corresponding or designated regions. It should be noted that since clock fabric is programmable, an RCS can be optionally selected from an output of PLL and output of clock source 402. PLL generates an output based on input references from RCS, clock source, NCS, and/or SCS. The selected RCS is subsequently forwarded to a designated region such as bank0 region 302.

Inter-regional clock generator 412, also known as neighboring clock generator, is capable of generating a set of neighboring clock signals ("NCSs") or inter-regional clocks in accordance with the output(s) of clock source 402 as well as some feedback inputs. NCS is a primary inter-regional clock having a high CSQ since NCS can be a high-speed clock with relatively low tolerance of clock skew. A function of NCS is to drive logics situated at two neighboring regions with the same clock speed concurrently. For example, NCSs can be used to clock DLBs, EBR, and/or DSP units in two regions at the same time.

Secondary clock generator 416 generates a set of secondary clock signals ("SCSs") or secondary clocks in accordance with the outputs of RCSs. SCS is a secondary regional clock with a lower CSQ. A function of SCSs is to drive the logics with lower clock speed wherein the logic can handle greater clock skew. For example, SCSs are used to clock DLBs, EBR, and/or DSP units with less time-sensitive logic operations. For instance, SCSs can be used for components resetting, activating, deactivating, and the like. Secondary clock generator 416, in one application, can also generate one or more global SCSs or secondary global clocks for clocking less time-sensitive logic operations.

Global clock generator 418, in one embodiment, is used to generate a set of global clock signals ("GCSs") in accordance with clock sources 402, RCSs, and/or NCSs. GCS is a primary regional signal with high CSQ. A function of GCSs is to drive logics within the PSD or FPGA at the same clock speed. For example, GCSs are used for clocking or driving DLBs, EBR, and/or DSP units in all regions with substantially the same clock speed.

In one operation, clock source 402 generates a set of clock signals 430, which are subsequently distributed to regional clock generator 410, inter-regional clock generator 412, secondary clock generator 416, and global clock generator 418. Regional clock generator 410 generates a set of RCSs such as 64 regional signals 432, which are subsequently forwarded to clock selector 408, secondary clock generator 416, and global clock generator 418. Upon selection at clock selector 408, RCSs 432 are traveled to all regions 302-316 as indicated by numeral 438.

Inter-regional clock generator 412, in one embodiment, generates a set of NCSs, which is subsequently forwarded to multiple regions 302-316 as indicated by numeral 434. Upon receiving inputs of RCSs, NCSs, and clock signals 430, secondary clock generator 416 generates a set of SCSs for facilitating less time-sensitive logic operations. Also, a set of GCSs is generated by global clock generator 418 for providing a global clock signal to the entire chip or FPGA. In one aspect, GCS is used to synchronize clock signals for the device, PSD, or FPGA. It should be noted that GCSs can be used to clock logic blocks in all four (4) quadrants of FPGA.

An advantage of employing CCD is that it allows a device to run at different clock cycles at different regions of the chip or FPGA.

Figure 5A:
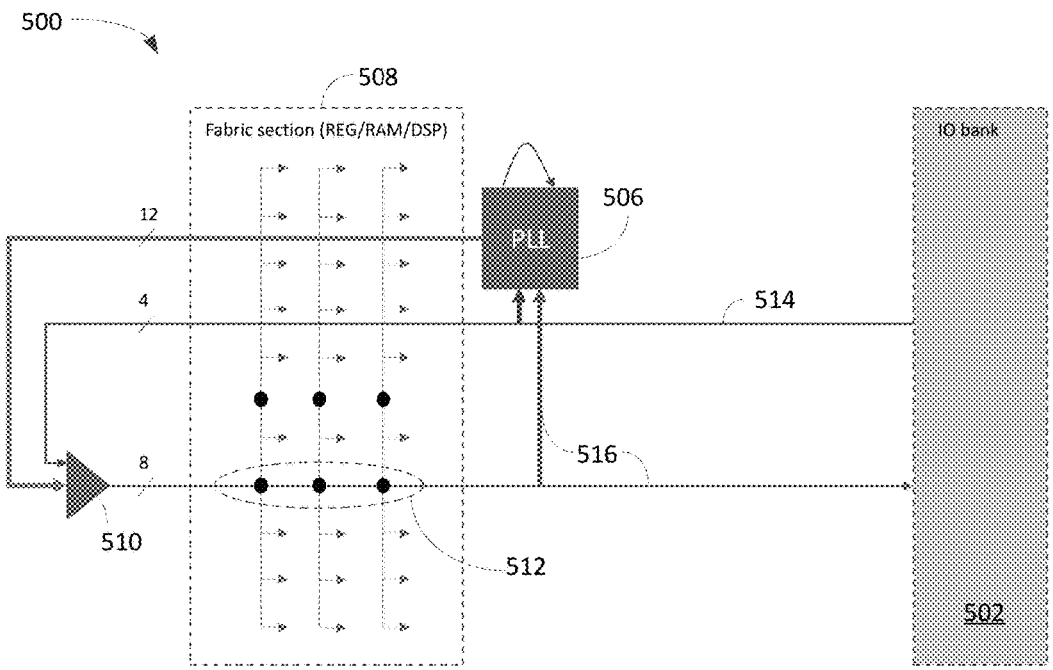
FIG. 5A is a block diagram illustrating a clock region with PLL and IO block for facilitating CCD in accordance with one embodiment of the present invention.

FIG. 5A is a block diagram 500 illustrating a clock region with PLL and IO block for facilitating CCD in accordance with one embodiment of the present invention. Diagram 500 includes an IO bank 502, PLL 506, fabric section 508, and selector 510. Upon receiving a clock signal, IO block 502 provides clock signal 514 to PLL 506 and selector 510. PLL 506 generates a PLL output based on the input signals from clock signal 514 and output of selector 510 as indicated by numeral 516. Upon receipt of clock signal 514 and PLL output, selector 510 selects a clock signal for fabric section 508 to clock logic devices or regions as indicated by numeral 512. It should be noted that the underlying concept of the exemplary embodiment(s) of the present invention would not change if one or more blocks (circuit or elements) were added to or removed from diagram 500.

Figure 5B:
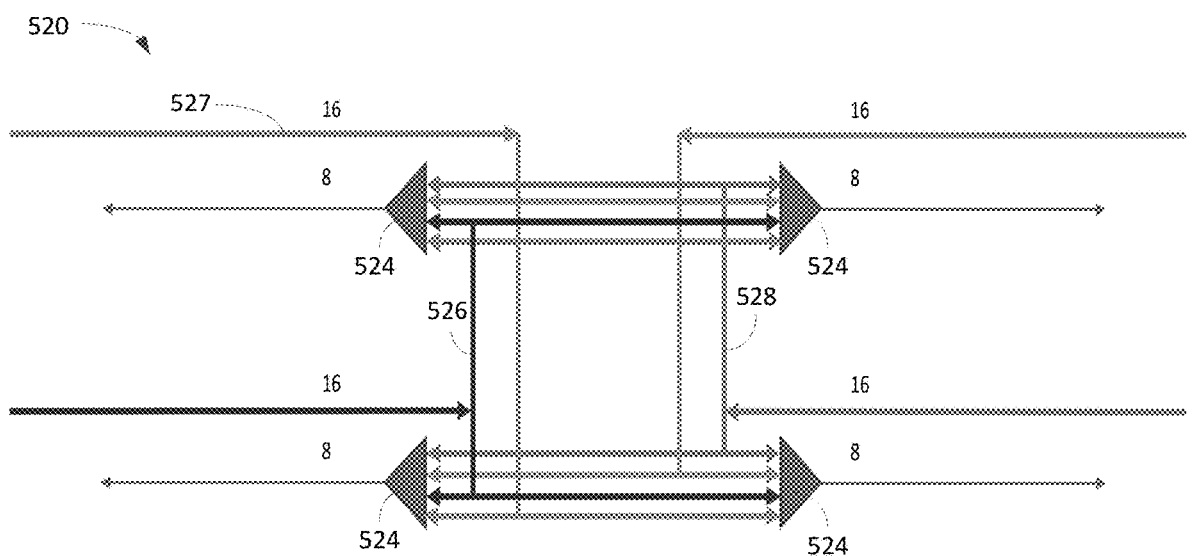
FIG. 5B is a block diagram illustrating a clock signal distribution to multiple clock regions for facilitating CCD in accordance with one embodiment of the present invention.

FIG. 5B is a block diagram 520 illustrating a clock signal distribution to multiple clock regions for facilitating CCD in accordance with one embodiment of the present invention. Diagram 520 illustrates four (4) selectors 524 capable of handling 32 output clock signals for either a top half or bottom half of FPGA. In one aspect, selectors 524 are capable of distributing clock signals base on input clocks from various other quadrants or regions as indicated by numeral 526-528. It should be noted that the underlying concept of the exemplary embodiment(s) of the present invention would not change if one or more blocks (circuit or elements) were added to or removed from diagram 520.

Figure 5C:
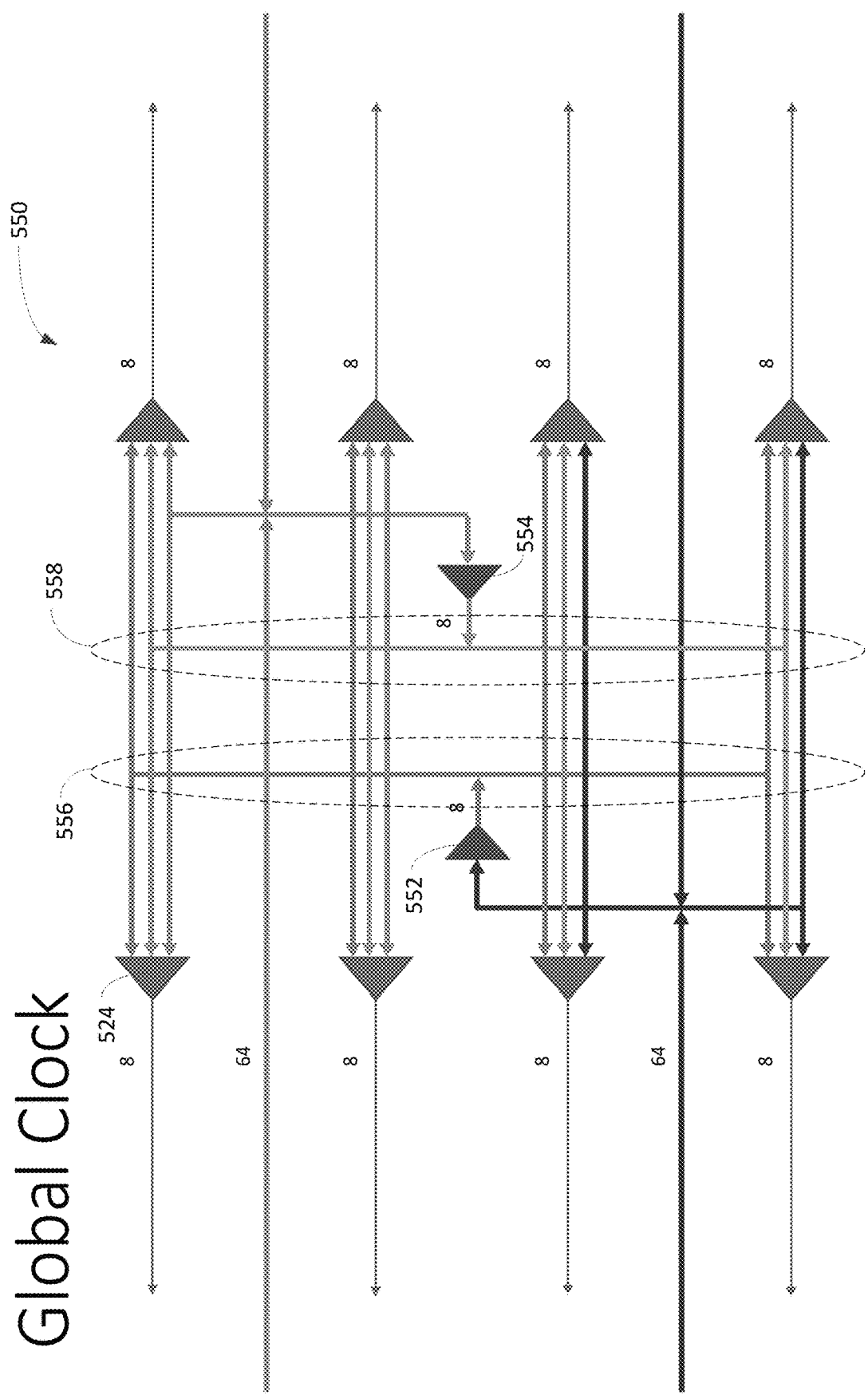
FIG. 5C is a block diagram illustrating a clock distribution to provide a set of signals as global clocks capable of driving an entire chip or PSD in accordance with one embodiment of the present invention.

FIG. 5C is a block diagram 550 illustrating a clock distribution to provide a set of signals as global clocks capable of driving an entire chip or PSD in accordance with one embodiment of the present invention. Diagram 550 illustrates eight (8) selectors 524 capable of handling 64 global output clocks or GCSs for FPGA. In one aspect, selectors 524 are capable of distributing clock signals base on input clock signals from various other quadrants and/or regions as indicated by numeral 556-558. In one embodiment, selectors 552-554 are used to provide additional programmability. It should be noted that the underlying concept of the exemplary embodiment(s) of the present invention would not change if one or more blocks (circuit or elements) were added to or removed from diagram 550.

Figure 6A:
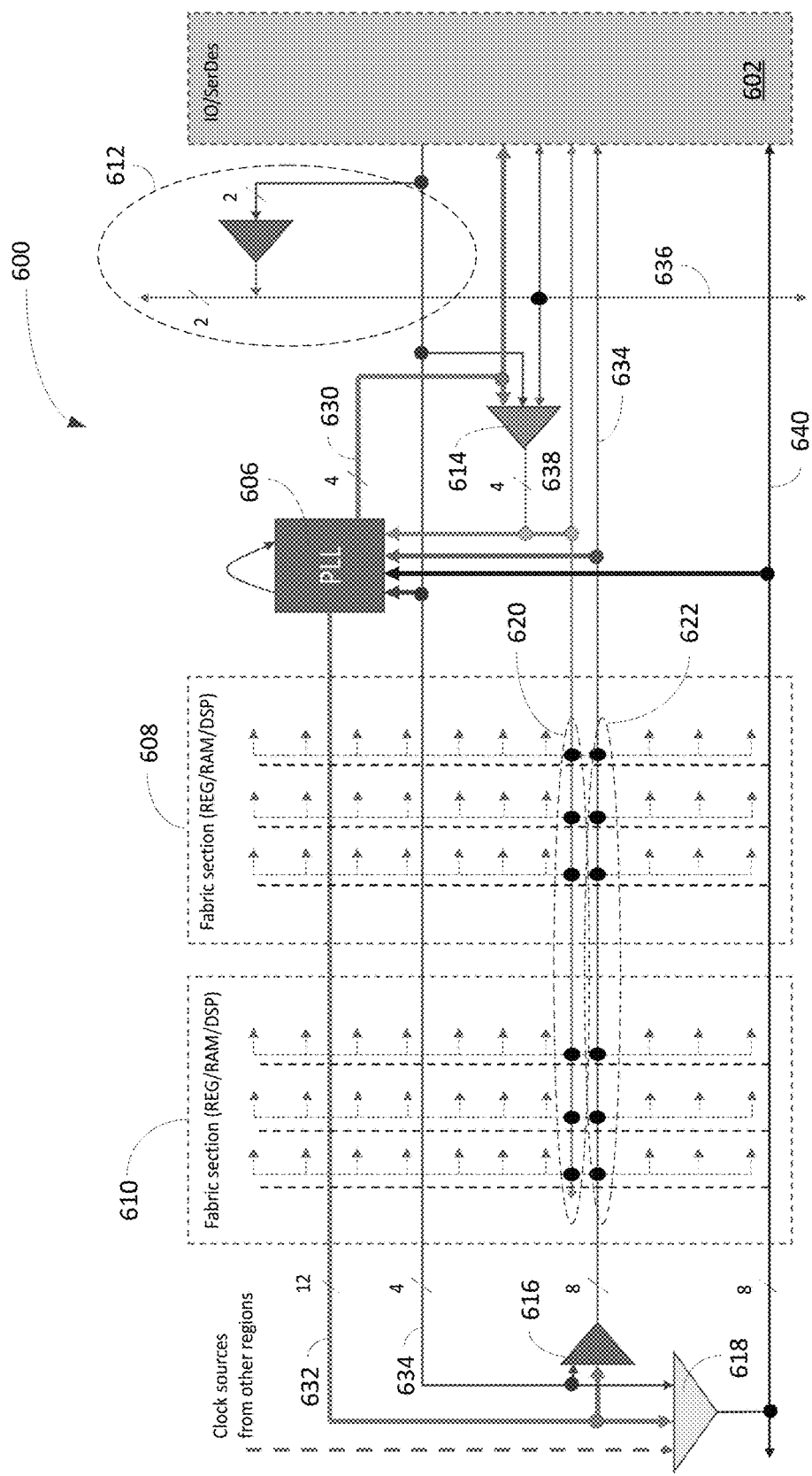
FIG. 6A is a block diagram illustrating a portion of CCD configured to generate regional clocks, inter-regional clocks, and secondary clocks for facilitating CCD operation in accordance with one embodiment of the present invention.

FIG. 6A is a block diagram 600 illustrating a portion of CCD configured to generate regional clocks, inter-regional clocks, and secondary clocks for facilitating CCD operation in accordance with one embodiment of the present invention. Diagram 600 includes an IO bank or SerDes 602, PLL 606, fabric sections 608-610, and selectors 616-618. Diagram 600 further includes an inter-regional element 612 and selector 614 for handling direct input 638 to fabric sections 608-610 as indicated by numeral 620. It should be noted that the underlying concept of the exemplary embodiment(s) of the present invention would not change if one or more blocks (circuit or elements) were added to or removed from diagram 600.

Upon receiving a clock, IO block 602 provides a clock signal 634 to PLL 606, selectors 614-618, and inter-regional element 612. PLL 606 generates a PLL output 632 based on the inputs from clock signal 634 and outputs of selectors 614-618. Upon receipt of clock signal 634 and PLL output 632, selector 616 provides (or selects) a clock signal for fabric sections 608-610 to clock corresponding logic devices or regions as indicated by numeral 622. It should be noted that the fabric section corresponds to clock regions.

Selector 618, in one embodiment, generates a secondary clock or SCS 640 based on inputs from clock signal 634, the output of PLL 632, and/or other clock sources from other regions. Output 640 from selector 618 is forwarded to IO block 602 and/or PLL 606. Inter-regional element 612, in one embodiment, generates NCSs 636 based on clock signal 634. In one aspect, NCSs 636 are fed to selector 614 for generating direct input 638.

The secondary clock generator, in one embodiment, employs various selectors such as selector 618 capable of facilitating low-speed IO clock, which can also be abbreviated as BUFR. The low-speed IO clock, in one example, is extended to a regional clock network for facilitating SerDes operation. A distribution tree of four (4) low-speed clocks covers the whole region. While low-speed clock can be a PLL reference clock, the low-speed clock can also be driven by the SerDes clock or PLL output clock. It should be noted that the low-speed clock can also be generated by dividing the high-speed clock.

Inter-regional element 612, in one embodiment, includes two (2) multi-region clock bus, which can be abbreviated to BUFMR, situated from left to right side of the PSD or FPGA. While the multi-region clock can drive the slow-speed clock(s) and/or the IO cross regions, the multi-region clock may also be driven by IO and/or SerDes multi-region clock(s). It should be noted that the multi-region clock can be used for a high-speed clock for clocking neighboring regions simultaneously.

Figure 6B:
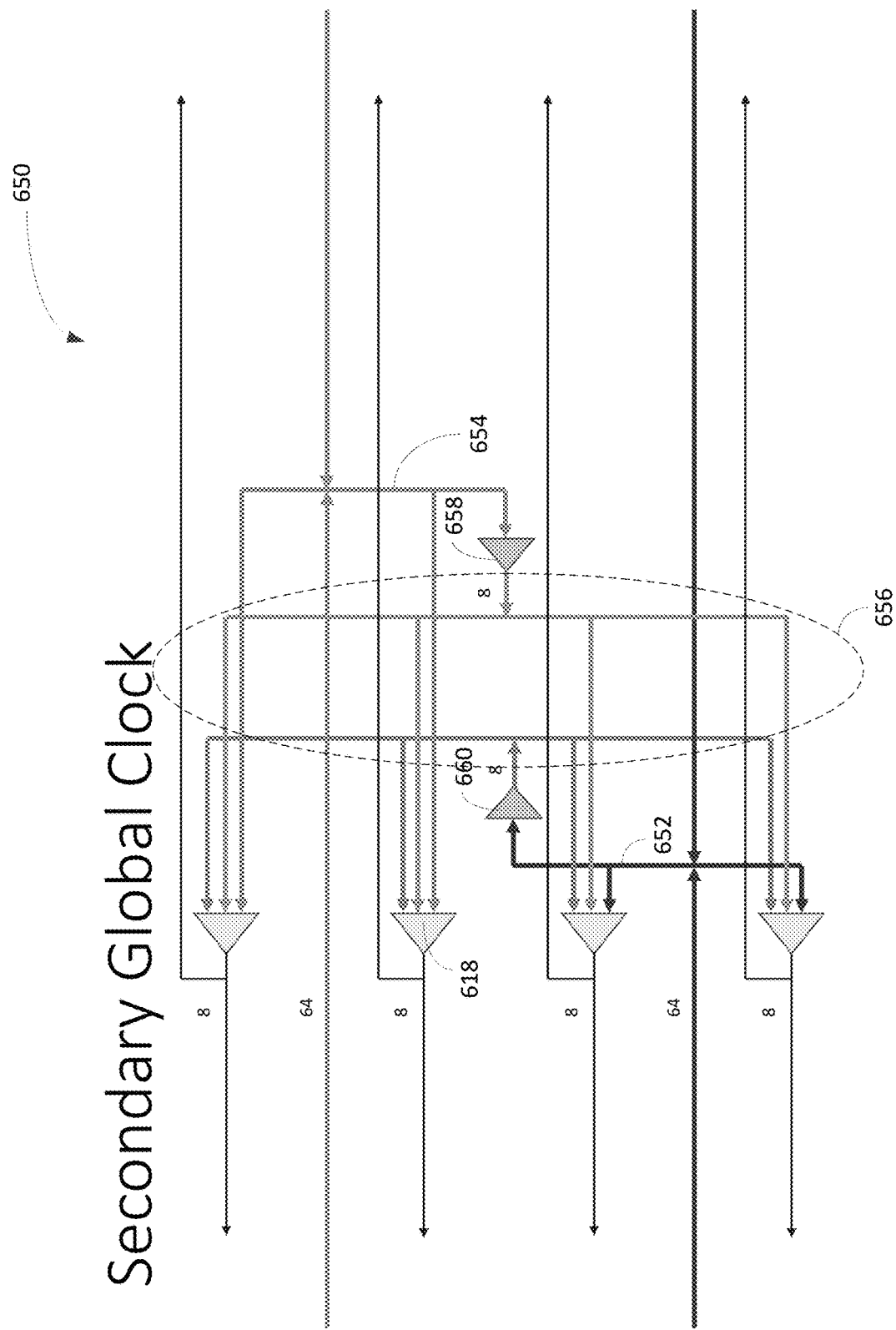
FIG. 6B is a block diagram illustrating a secondary global clock to distribute a set of secondary global clock signals capable of driving at least a portion of PSD in accordance with one embodiment of the present invention.

FIG. 6B is a block diagram illustrating a secondary global clock to distribute a set of secondary global clock signals capable of driving at least a portion of PSD in accordance with one embodiment of the present invention. Diagram 650 illustrates four (4) selectors 618 capable of producing 32 secondary global clock signals or SCSs for PSD or FPGA. In one aspect, selectors 618 are capable of distributing clock signals base on input clock signals from various other quadrants as indicated by numeral 652-656. In one embodiment, selectors 658-660 are used to provide additional programmability to process connections indicated by numeral 656. It should be noted that the underlying concept of the exemplary embodiment(s) of the present invention would not change if one or more blocks (circuit or elements) were added to or removed from diagram 650.

The secondary clock, which is basically similar to the primary clock, includes a total of four (4) secondary regions wherein each secondary region covers two (2) primary clock regions. It should be noted that clock delay and clock skew for the secondary clock can be bigger or greater than the primary clock. In one aspect, each secondary clock region has eight (8) secondary clocks ("BUFS") driving fabric and IO in the region. While the secondary clocks share the same sources as the primary clocks, the secondary clocks, in one example, also share the PLLs with the primary clocks. It should be noted that two (2) adjacent (top/bottom half) regions exchange the primary clock sources with other regions. For example, 16 secondary global clocks ("BUFSG") bridge between the top and bottom half of FPGA. Each secondary global clock is able to feed to all secondary clocks in all regions. It should be noted that eight (8) secondary global clocks are driven by the secondary clocking sources in the top (bottom) half of FPGA.

Figure 6C:
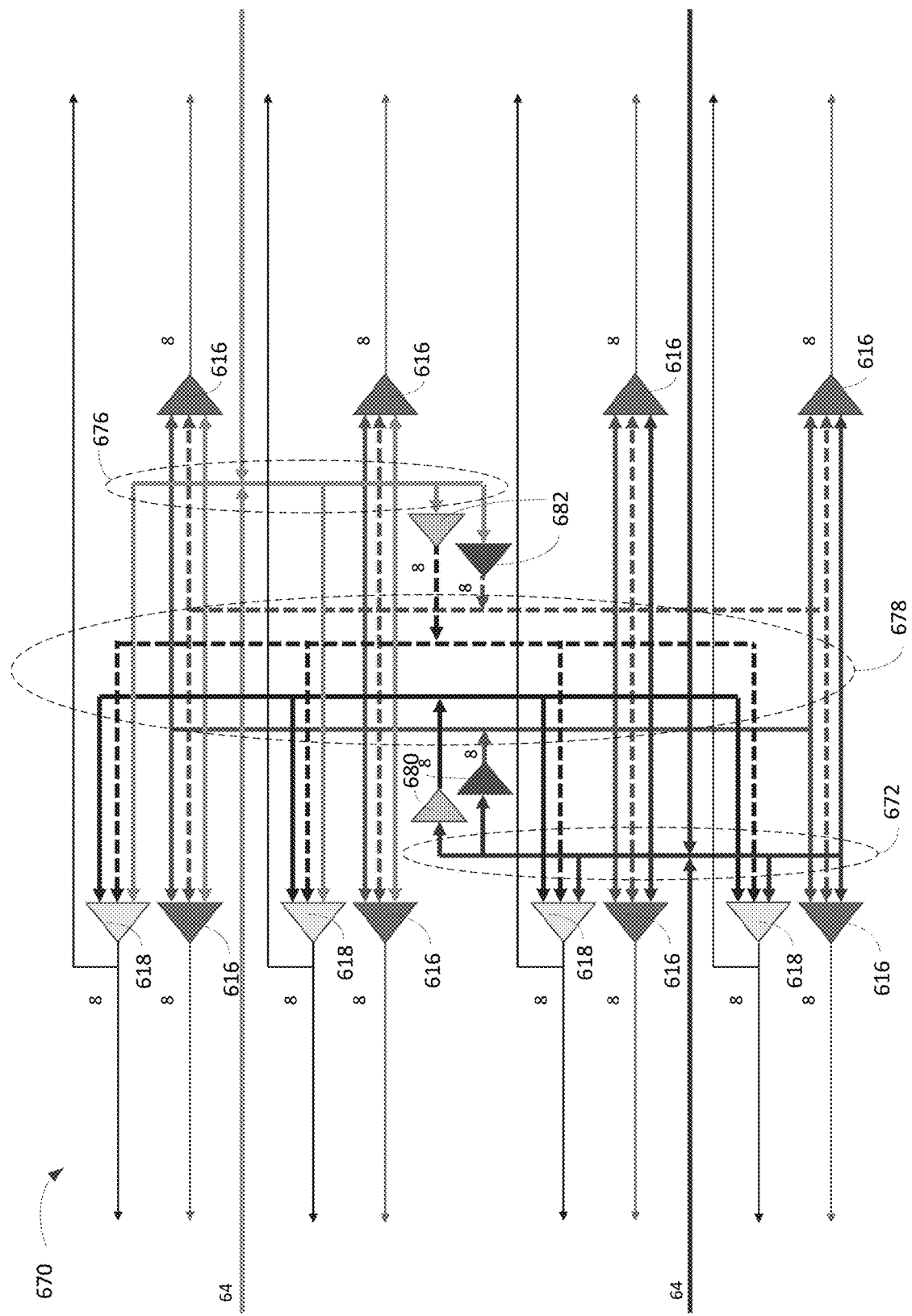
FIG. 6C is a block diagram illustrating a CCD operation providing both primary global clocks and secondary global clocks to drive PSD or FPGA in accordance with one embodiment of the present invention.

FIG. 6C is a block diagram 670 illustrating a CCD operation providing both primary global clocks and secondary global clocks to drive PSD or FPGA in accordance with one embodiment of the present invention. Diagram 670 illustrates four (4) secondary selectors 618 for secondary clocks and eight (8) primary selectors 616 for providing primary global clocks and/or secondary global clock signals to PSD or FPGA. To enhance programmability, selectors 680-682 are used to provide additional flexibilities via connections 672-678. It should be noted that the underlying concept of the exemplary embodiment(s) of the present invention would not change if one or more blocks (circuit or elements) were added to or removed from diagram 670.

An advantage of using primary and secondary global clocks is to improve the overall efficiency of FPGA in terms of power consumption and speed.

Figure 7:
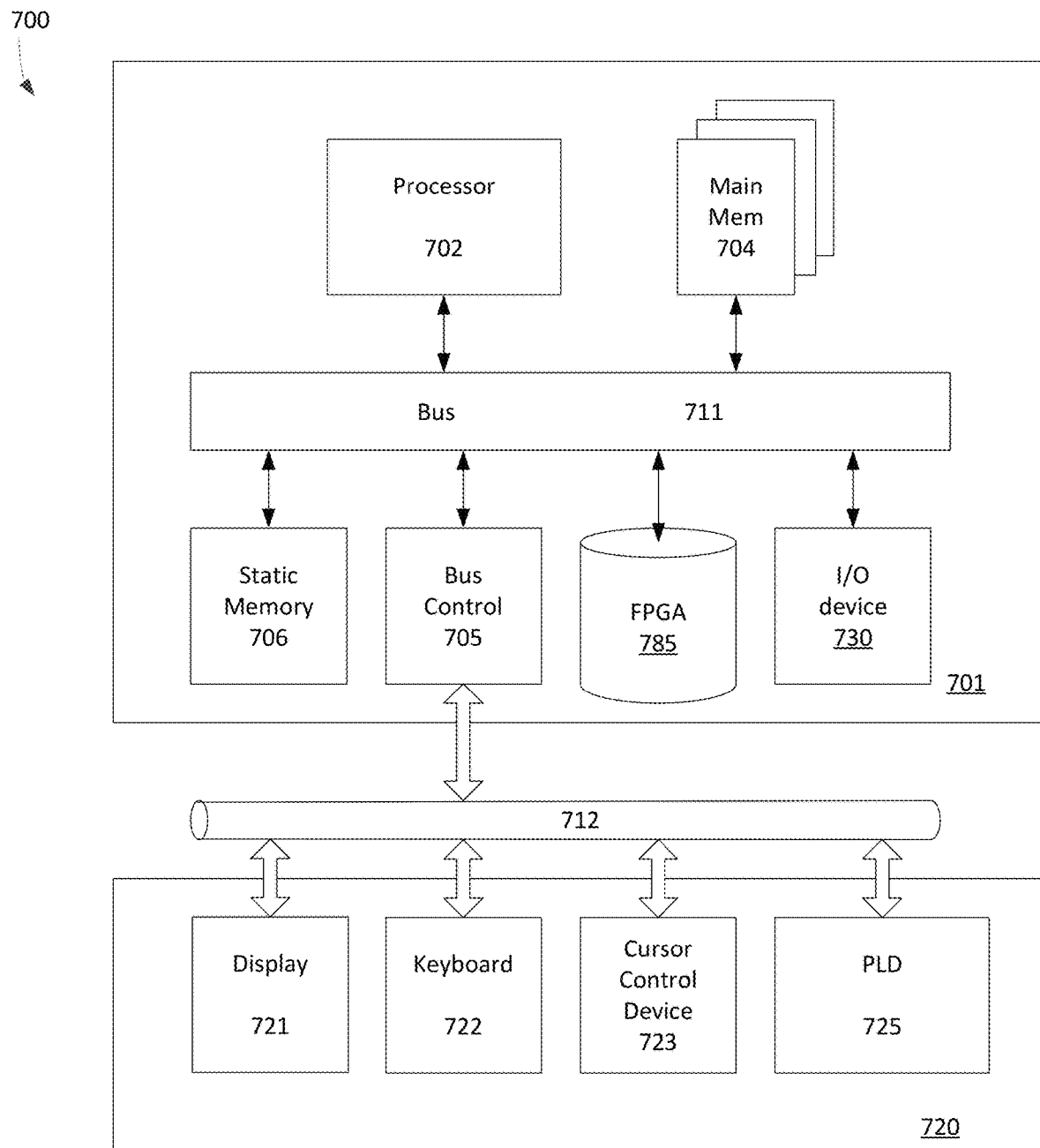
FIG. 7 is a diagram illustrating a system or computer using PSD with CCD to enhance programmability of PSD in accordance with one embodiment of the present invention.

FIG. 7 is a diagram 700 illustrating a system or the computer using PSD with CCD to enhance programmability of PSD in accordance with one embodiment of the present invention. Computer system 700 includes a processing unit 701, an interface bus 712, and an input/output ("IO") unit 720. Processing unit 701 includes a processor 702, main memory 704, system bus 711, static memory device 706, bus control unit 705, IO element 730, and FPGA 785. It should be noted that the underlying concept of the exemplary embodiment(s) of the present invention would not change if one or more blocks (circuit or elements) were added to or removed from FIG. 7.

Bus 711 is used to transmit information between various components and processor 702 for data processing. Processor 702 may be any of a wide variety of general-purpose processors, embedded processors, or microprocessors such as ARM® embedded processors, Intel® Core™ Duo, Core™ Quad, Xeon®, Pentium™ microprocessor, Motorola™ 68040, AMD® family processors, or Power PC™ microprocessor.

Main memory 704, which may include multiple levels of cache memories, stores frequently used data and instructions. Main memory 704 may be RAM (random access memory), MRAM (magnetic RAM), or flash memory. Static memory 706 may be a ROM (read-only memory), which is coupled to bus 711, for storing static information and/or instructions. Bus control unit 705 is coupled to buses 711-712 and controls which component, such as main memory 704 or processor 702, can use the bus. Bus control unit 705 manages the communications between bus 711 and bus 712. Mass storage memory or SSD which may be a magnetic disk, an optical disk, hard disk drive, floppy disk, CD-ROM, and/or flash memories are used for storing large amounts of data.

IO unit 720, in one embodiment, includes a display 721, keyboard 722, cursor control device 723, and low-power PLD 725. Display device 721 may be a liquid crystal device, cathode ray tube ("CRT"), touch-screen display, or other suitable display devices. Display 721 projects or displays images of a graphical planning board. Keyboard 722 may be a conventional alphanumeric input device for communicating information between computer system 700 and computer operator(s). Another type of user input device is cursor control device 723, such as a conventional mouse, touch mouse, trackball, or other types of the cursor for communicating information between system 700 and user(s).

PLD 725 is coupled to bus 712 for providing configurable logic functions to local as well as remote computers or servers through a wide-area network. PLD 725 and/or FPGA 785 are configured to facilitate the operation of CCD to improve overall efficiency of FPGA and/or PLD. In one example, PLD 725 may be used in a modem or a network interface device for facilitating communication between computer 700 and the network. Computer system 700 may be coupled to servers via a network infrastructure as illustrated in the following discussion.

Figure 8:
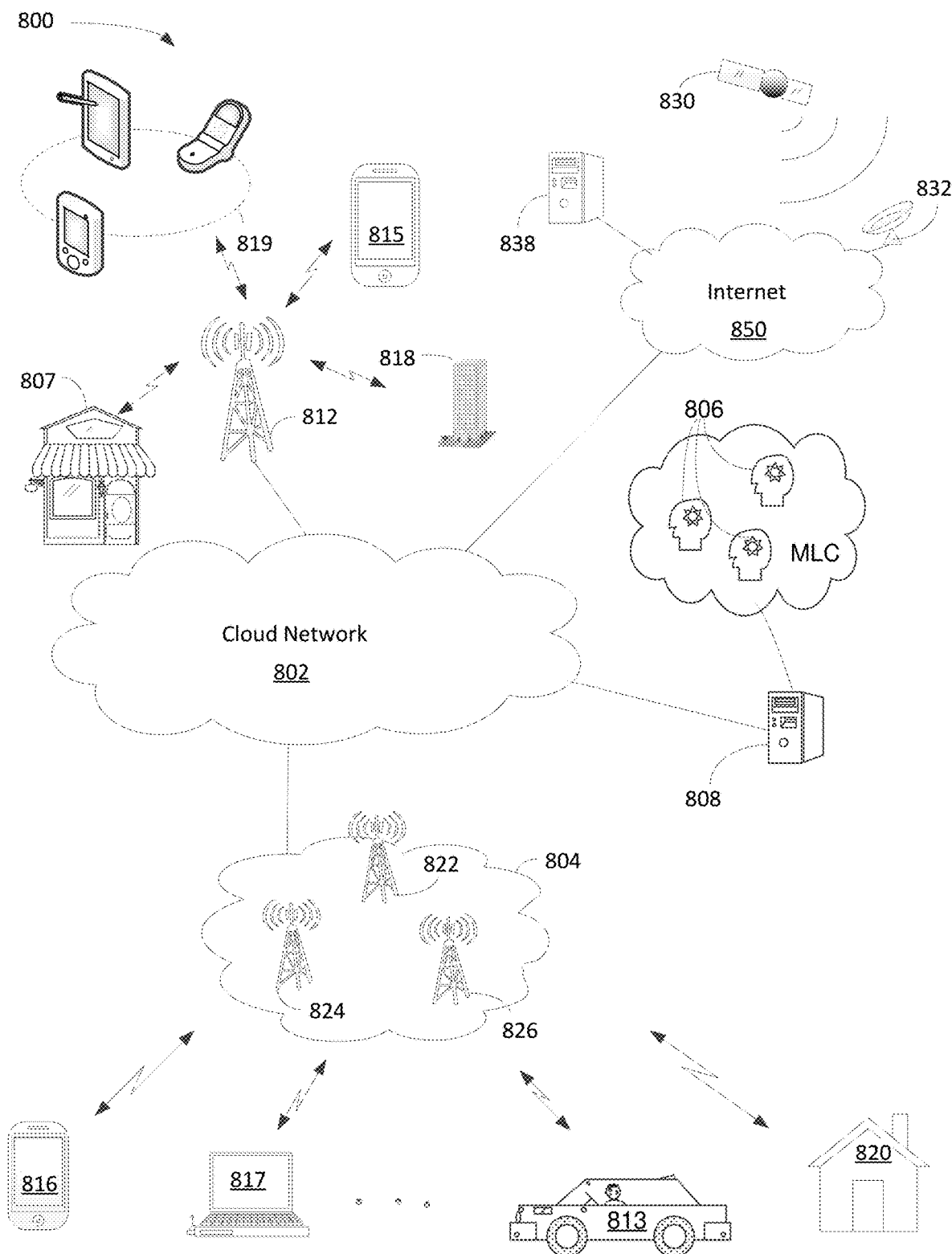
FIG. 8 is a block diagram illustrating various applications of PSD (e.g. FPGA, PLD, etc.) capable of facilitating user-defined logic functions using CCD in accordance with one embodiment of the present invention.

FIG. 8 is a block diagram 800 illustrating various applications of PSD (e.g. FPGA, PLD, etc.) capable of facilitating user-defined logic functions using CCD in accordance with one embodiment of the present invention. Diagram 800 illustrates AI server 808, communication network 802, switching network 804, Internet 850, and portable electric devices 813-819. In one aspect, PSD capable of facilitating a CCD operation is used in an AI server, portable electric devices, and/or switching network. Network or cloud network 802 can be a wide area network, metropolitan area network ("MAN"), local area network ("LAN"), satellite/terrestrial network, or a combination of a wide-area network, MAN, and LAN. It should be noted that the underlying concept of the exemplary embodiment(s) of the present invention would not change if one or more blocks (or networks) were added to or removed from diagram 800.

Network 802 includes multiple network nodes, not shown in FIG. 8, wherein each node may include mobility management entity ("MME"), radio network controller ("RNC"), serving gateway ("S-GW"), packet data network gateway ("P-GW"), or Home Agent to provide various network functions. Network 802 is coupled to Internet 850, AI server 808, base station 812, and switching network 804. Server 808, in one embodiment, includes machine learning computers ("MLC") 806.

Switching network 804, which can be referred to as packet core network, includes cell sites 822-826 capable of providing radio access communication, such as 3G ($3^{rd}$ generation), 4G, or 5G cellular networks. Switching network 804, in one example, includes IP and/or Multiprotocol Label Switching ("MPLS") based network capable of operating at a layer of Open Systems Interconnection Basic Reference Model ("OSI model") for information transfer between clients and network servers. In one embodiment, switching network 804 is logically coupling multiple users and/or mobiles 816-820 across a geographic area via cellular and/or wireless networks. It should be noted that the geographic area may refer to campus, city, metropolitan area, country, continent, or the like.

Base station 812, also known as cell-site, node B, or eNodeB, includes a radio tower capable of coupling to various user equipments ("UEs") and/or electrical user equipments ("EUEs"). The term UEs and EUEs are referring to similar portable devices and they can be used interchangeably. For example, UEs or PEDs can be cellular phone 815, laptop computer 817, iPhone® 816, tablets, and/or iPad® 819 via wireless communications. A handheld device can also be a smartphone, such as iPhone®, BlackBerry®, Android®, and so on. Base station 812, in one example, facilitates network communication between mobile devices such as portable handheld device 813-819 via wired and wireless communications networks. It should be noted that base station 812 may include additional radio towers as well as other land switching circuitry.

Internet 850 is a computing network using Transmission Control Protocol/Internet Protocol ("TCP/IP") to provide linkage between geographically separated devices for communication. Internet 850, in one example, couples to supplier server 838 and satellite network 830 via satellite receiver 832. Satellite network 830, in one example, can provide many functions as wireless communication as well as a global positioning system ("GPS"). It should be noted that the CCD operation enhancing efficiency of FPGA can benefit many applications, such as but not limited to, smartphones 813-819, satellite network 830, automobiles 813, AI servers 808, business 807, and homes 820.

The exemplary embodiment of the present invention includes various processing steps, which will be described below. The steps of the embodiment may be embodied in machine or computer-executable instructions. The instructions can be used to cause a general-purpose or special-purpose system, which is programmed with the instructions, to perform the steps of the exemplary embodiment of the present invention. Alternatively, the steps of the exemplary embodiment of the present invention may be performed by specific hardware components that contain hard-wired logic for performing the steps, or by any combination of programmed computer components and custom hardware components.

Figure 9:
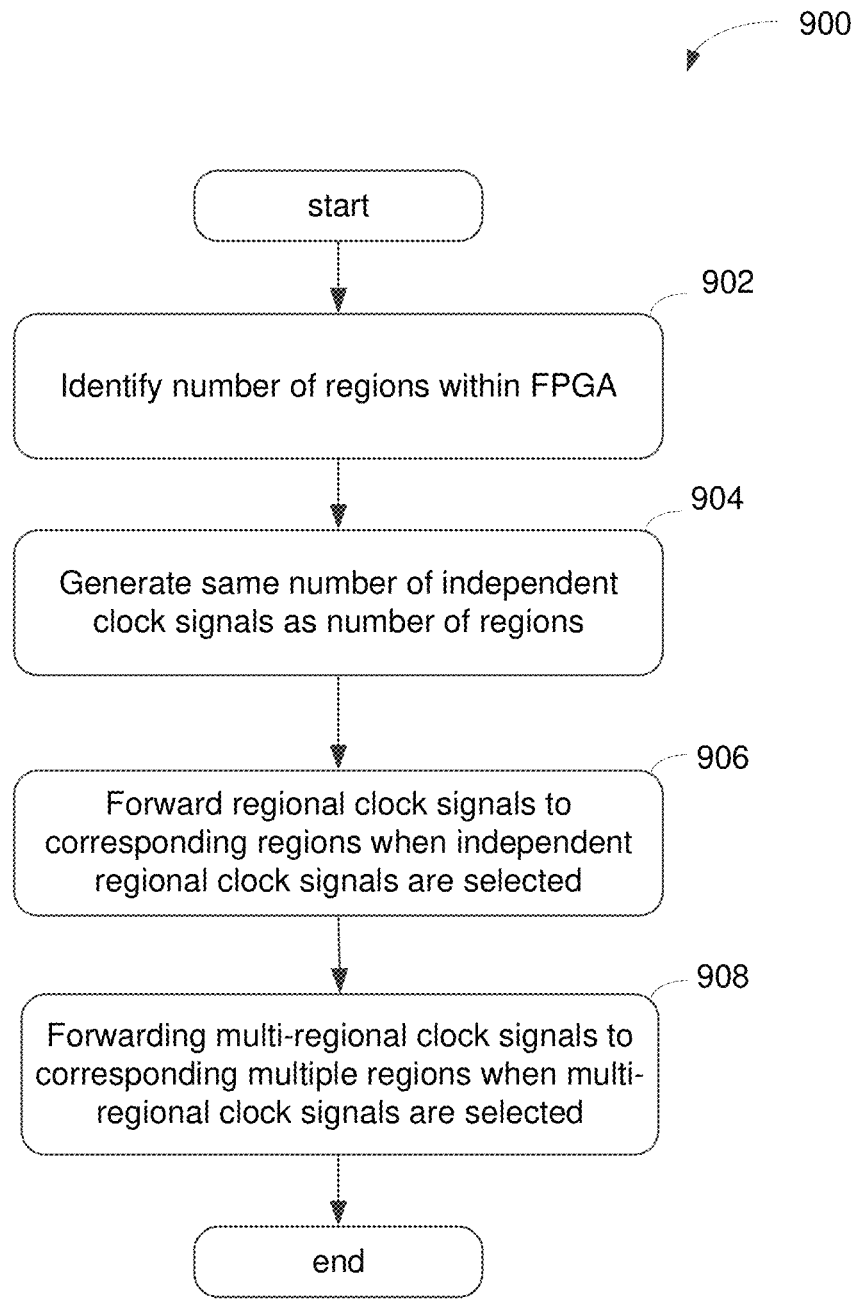
FIG. 9 is a flowchart illustrating a process of logically separating or dividing a PSD into multiple quadrants for creating clock regions in accordance with one embodiment of the present invention.

FIG. 9 is a flowchart 900 illustrating a process of logically separating or dividing a PSD into multiple quadrants for creating clock regions in accordance with one embodiment of the present invention. At block 902, a process of CCD for driving regional logic blocks identifies the number of active regions within four quadrants of an FPGA. For example, the FPGA can be logically divided into four (4) quadrants wherein each quadrant can be further divided into two clock regions. In one aspect, all regions should be organized with similar logic capacities and IOs.

At block 904, the same or similar number of independent clocks or clock signals as the number of active regions are generated in response to configuration information and clock sources.

At block 906, the process is capable of forwarding designated regional clock signals to correspond designated regions when independent regional clock signals are selected. In one aspect, different clocks with different clock speeds are used to drive or clock different regions whereby CCD allows different regions running at different clock speeds.

At block 908, the multi-regional clock signals or inter-regional clock are forwarded to corresponding multiple regions when multi-regional clock signals are selected. It should be noted that multi-regional or inter-regional clocks facilitate multiple regions operating under the same clock speed. In one example, a global clock signal is forwarded to all regions when the global clock signal is selected.

Figure 10:
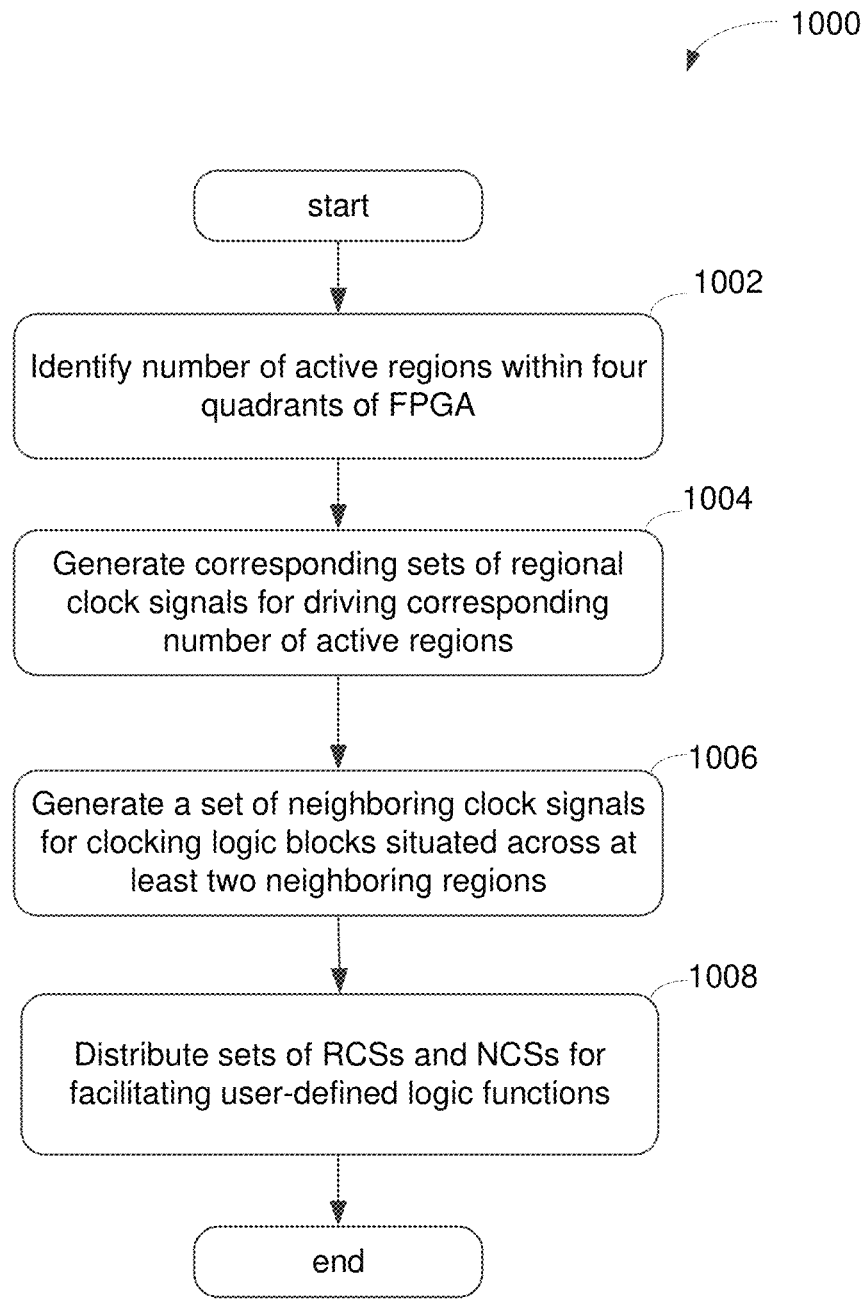
FIG. 10 is a flowchart illustrating a process of CCD for generating clock signals to drive PSD in accordance with one embodiment of the present invention.

FIG. 10 is a flowchart 1000 illustrating a process of CCD for generating clock signals to drive PSD in accordance with one embodiment of the present invention. At block 1002, a process of CCD for providing multiple sets of clocks is able to identify the number of active regions within four quadrants of an FPGA. In one example, eight (8) regions in the four quadrants are determined wherein each quadrant includes two (2) regions.

At block 1004, corresponding sets of RCSs or regional clocks having a first CSQ for driving the corresponding number of active regions of the four quadrants are generated in accordance with one or more clock sources. In one aspect, the first CSQ is a high-quality clock cycle with high accuracy.

At block 1006, the process is capable of generating a set of inter-regional clocks or NCSs having the first CSQ for clocking logic blocks situated across at least two neighboring regions.

At block 1008, the sets of RCSs and the set of NCSs are distributed to active regions in the FPGA for facilitating user-defined logic functions. In one aspect, the process of CCD is further capable of generating a set of SCSs or secondary clocks having a second CSQ in accordance with the sets of RCSs for driving logic blocks with less time-sensitive logic operations. The second CSQ, in one example, is referred to as a lower clock quality. In one operation, the designated RCSs are forwarded to corresponding designated regions when independent regional clock signals are selected. Alternatively, one or more NCSs are forwarded to multiple neighboring regions when multi-regional clock signals are selected. The process is also able to forward a global clock signal to all regions when the global clock signal is selected.

While particular embodiments of the present invention have been shown and described, it will be obvious to those of ordinary skills in the art that based upon the teachings herein, changes and modifications may be made without departing from this exemplary embodiment(s) of the present invention and its broader aspects. Therefore, the appended claims are intended to encompass within their scope all such changes and modifications as are within the true spirit and scope of this exemplary embodiment(s) of the present invention.

What is claimed is:

1. A configurable semiconductor device ("CSD") organized in four (4) quadrants able to perform user-defined logic functions, the CSD comprising:
    a first quadrant of the CSD configured to include a first serializer and deserializer ("SerDes") region operating via first SerDes clock signals for data transmission and a bank0 region operating via first bank clock signals for data processing, wherein the first SerDes clock signals and the first bank clock signals have different clock speeds;
    a second quadrant of the CSD configured to include a second SerDes region for data transmission and a bank5 region for data processing;
    a third quadrant of the CSD configured to include a bank3 region for data processing and a bank4 region for data processing;
    a fourth quadrant of the CSD configured to include a bank1 region for data processing and a bank2 region for data processing; and
    a clock fabric coupled to the first, second, third, and fourth quadrants and configured to provide the first SerDes Clock signals and the first bank clock signals.

2. The CSD of claim 1, further comprising a microcontroller unit ("MCU") coupled to the bank0 region and configured to provide MCU functions.

3. The CSD of claim 1, further comprising a configuration block coupled to the bank1 region and configured to provide configuration functions.

4. The CSD of claim 1, further comprising a mobile industry processor interface ("MIPI") coupled to the bank5 region and configured to provide wireless communication to mobile devices.

5. The CSD of claim 1, wherein the CSD is a field-programmable gate array ("FPGA") capable of performing user-defined logic functions based on configuration data.

6. The CSD of claim 1, wherein the first and second SerDes regions include an embedded block ram ("EBR") and digital signal processing ("DSP") block for facilitating high-speed data communications.

7. The CSD of claim 1, wherein the bank0 region includes a programmable block, an input-output ("IO") block, and a microcontroller unit ("MCU") configured to perform user-defined logic functions.

8. The CSD of claim 7, wherein the programmable block includes a digital logic block ("DLB"), an embedded block ram ("EBR"), and digital signal processing ("DSP") block for facilitating user-defined data processing.

9. The CSD of claim 8, wherein the DLB includes configurable logic blocks ("LB s") having one or more lookup tables ("LUTs") and routing connections for performing user-programmed logic functions.

10. The CSD of claim 1, wherein the clock fabric is able to provide different clock speeds to different regions.

11. The CSD of claim 1, wherein the clock fabric is able to provide multiple sets of clock signals wherein some sets of clock signals contain different clock qualities.

12. The CSD of claim 1, wherein the clock fabric is configurable to provide global clock signals for all regions.

13. The CSD of claim 1, wherein the clock fabric is configurable and provides same clock signals to a plurality of regions.

14. A field-programmable gate array ("FPGA") organized in multi-quadrants able to perform user-defined logic functions, the FPGA comprising:
a first quadrant of the FPGA configured to include a first serializer and deserializer ("SerDes") region operating with first SerDes clock signals for data transmission and a bank0 region operating with first bank clock signals for data processing, wherein the first SerDes clock signals and the first bank clock signals have different clock speeds;
a second quadrant of the FPGA configured to include a second SerDes region operating with second SerDes clock signals for data transmission and a bank5 region operating with second bank clock signals for data processing; and
a clock fabric coupled to the first and the second quadrants and configured to provide the first SerDes Clock signals and the first bank clock signals.

15. The FPGA of claim 14 further comprising:
a third quadrant of the FPGA configured to include a bank3 region for data processing and a bank4 region for data processing; and
a fourth quadrant of the FPGA configured to include a bank1 region for data processing and a bank2 region for data processing.

16. The FPGA of claim 15 wherein the clock fabric is coupled to the first, second, third, and fourth quadrants and configured to provide a set of independent clock signals to each region.

17. The FPGA of claim 15, further comprising
a microcontroller unit ("MCU") coupled to the bank0 region and configured to provide MCU functions; and
a configuration block coupled to the bank1 region and configured to provide configuration functions.

18. A method for organizing a programmable logic device ("PLD") into four (4) quadrants for implementing user-defined logic functions comprising:
dividing the PLD into four (4) portions for performing user-defined logic functions in accordance with configuration data;
configuring a first portion of the PLD as a first quadrant of the PLD containing a first serializer and deserializer ("SerDes") region utilizing first SerDes clock signals for data transmission and a bank0 region utilizing first bank clock signals for data processing, wherein the first SerDes clock signals and the first bank clock signals have different clock speeds;
configuring a second portion of the PLD as a second quadrant of the PLD having a second SerDes region for data transmission and a bank5 region for data processing;
configuring a third portion of the PLD as a third quadrant of the PLD containing a bank3 region for data processing and a bank4 region for data processing; and
distributing the first SerDes clock signals and the first bank clock signals from a clock fabric to the first quadrant of the PLD.

19. The method of claim 18, further comprising configuring a fourth portion of the PLD as a fourth quadrant of the PLD including a bank1 region for data processing and a bank2 region for data processing.

20. The method of claim 18, further comprising providing the clock fabric to facilitate distribution of various clock signals to various regions operable in different clock speeds.

* * * * *